United States Patent Office 2,703,295
Patented Mar. 1, 1955

2,703,295

NONELECTROLYTIC METHOD FOR MAKING BI-METALLIC OFFSET PRINTING COPPER PLATING COMPOSITION AND METHOD OF PLATING

Morris S. Kantrowitz, Washington, D. C., and Alden E. Yelmgren, Borger, Tex.

No Drawing. Application October 7, 1952, Serial No. 313,616

3 Claims. (Cl. 117—130)

(Granted under Title 35, U. S. Code (1952), sec. 266)

The invention described herein may be manufactured and used by or for the Government of the United States for governmental purposes without the payment to us of any royalty thereon in accordance with the provisions of the act of April 30, 1928. (Ch. 460, 45 Stat. L. 467).

This invention relates generally to metal plating, and, more particularly, to improvements in the method of producing bi-metallic offset printing plates wherein a metal base is provided with a raised metal printing image.

The usually accepted method of making a bi-metallic printing plate is that of taking a base-metal plate, such as stainless steel, and electroplating onto this base metal a film of copper. The bi-metallic plate is coated with a stencil, exposed, and then developed with corrosive acids to remove the copper from the non-print areas. The copper printing image is then freed from the protective stencil by application of acid and mild abrasives. It is apparent that this method of platemaking is not convenient for the average printing house. Where electrolytic plating facilities are not available, the plate maker must buy the coppered plate from an outside source. The prepared plate is expensive. Also, preparing the plate for printing requires the use of highly corrosive acids. These are always a hazard, even when used under ideal conditions.

Accordingly, an object of this invention is to eliminate the aforementioned difficulties and to provide a method of preparing offset printing plates that may be used in any printing house.

Another object of this invention is to provide an improved chemical method for depositing a hard adherent film of copper upon a more electropositive base metal.

A further object of this invention is to provide a novel composition from which copper may be readily deposited upon more electropositive metals to form a hard adherent film.

A still further object of this invention is to provide a method of preparing bi-metallic offset printing plates utilizing chemical action for depositing a hard adherent metal film in the image area.

The foregoing and related objects hereinafter apparent as the ensuing description proceeds are accomplished by this invention, wherein:

The novel plating composition comprises essentially a copper salt, ammonium hydroxide, a strong reducer, and a mutual solvent.

The process comprises coating a metal base plate with a stencil in a suitable manner, applying an ammoniacal solution containing a copper salt and a strong reducer to the uncoated metal surfaces whereby a film of copper is deposited on the base metal, drying the plated metal, and removing the stencil.

The basic principle of galvanic action wherein a less active metal, for example copper, is replaced from solution by a more active metal is well known. Processes utilizing this principle usually deposit the copper from an acid solution. Copper so deposited forms as a black film having little adhesion to the base metal, and is unsuitable for use in preparing copper surfaces subject to rigorous conditions as are printing plates. According to the present invention, it has been discovered that a hard bright copper film of highly adherent properties may be deposited from an alkaline solution utilizing a suitable reducing agent.

The plating solution of this invention may be applied to any of the commonly used platemaking metals such as zinc, aluminum, and steel with but minor variations in the proportions of the components in order to obtain optimum results with the particular metal used. However, since zinc is the most commonly used base plate material for printing plates, the invention will be described with the use of zinc plates.

The preferred coating composition is an aqueous solution containing from about 5 to 10 per cent of a copper salt, such as copper sulfate, preferably about 8 per cent $CuSO_4$, about 4 to 6 per cent pyrogallol, preferably about 5 per cent, and about 2 to 5 per cent ammonium hydroxide, preferably about 3 per cent. Any water soluble copper salt as for example the chlorides, sulfates, nitrates, etc., may be used in the plating composition, copper sulfate being preferred merely because of its ready availability at reasonable cost.

While mutual solvents other than water may be employed in the composition, as for example, alcohol, water base solutions are preferred because they are more economical. Other more expensive solvents do not appear to give a better deposit of copper.

The ammonia may be replaced by certain other alkaline materials to supply the required solution alkalinity without departing from the spirit and scope of this invention. However, of the "alkalies" available, ammonia is the most suitable. The various hydrocarbon amines (ethyl amine, propyl amine, butyl amine, etc.), although usable, are more expensive than ammonia, have undesirable odors and do not give as bright copper deposits as ammonia. The common metal alkalies, such as sodium and potassium, form insoluble complexes and cannot be satisfactorily employed in this process.

The concentration of ammonia in the solution is the most critical feature in obtaining a satisfactory copper deposit. If insufficient ammonium hydroxide is present, the copper is deposited slowly and a thin copper film is formed. An excessive amount prevents proper deposition of copper and is detrimental to the hardened coating. The excess ammonia appears to cause resolution of the copper almost as soon as it is formed.

However, the proportions of ammonia that are chosen for one set of conditions may not be the most desirable under all conditions. For example, when copper plating a small size lithographic plate of the type generally used on a "Multilith" for office duplication, 50 per cent more ammonia may be used than when plating a standard size plate used on an offset press. Since the preferred amount of ammonium hydroxide present is relatively small for the second mentioned operation, as for example about 2.5 per cent, a 50 per cent increase is not an excessive quantity. The explanation of this difference in tolerence to ammonium hydroxide concentration is believed to reside in the fact that ammonia is apparently one of the end products of the reduction of copper sulfate with pyrogallol or other reducer used. Consequently, when a large volume of the plating solution is worked back and forth across a large plate, local areas may have excess concentrations of ammonia acting detrimentally on the plate when the solution is relatively high in ammonia concentration. This does not occur on a small plate since it is usually developed in a tray, thereby permitting a more efficient handling of the plating solution.

The reducer is preferably a compound selected from the general class of compounds consisting of one benzene nucleus with not fewer than two hydroxy groups, one or more of which may be replaced with amino groups. Compounds of this class are widely used as developers in the photographic trade. Pyrogallic acid is the preferred reducer of this class of compounds. "Amidol" (diaminophenol dihydrochloride) and Metol are developers of the same general type as pyrogallol, but have a higher reducing potential. While these compounds may be substituted for pyrogallol, their high cost makes them almost prohibitive for large scale plating work.

Reducers not of the general type as those mentioned above, such as hydroxyl-amine and hydrazine, although classed as strong reducers, are less satisfactory than pyrogallol and the related compounds in the practice of this invention.

It is possible to deposit copper on a zinc plate from an ammonical copper solution without the use of a reducer. However, the deposit is light and does not strongly adhere to the zinc. The combination of the copper salt, ammonia, and particular reducer in proper proportions as specified herein makes possible the production of a copper film or plate comparable to that deposited electrolytically.

Any of the methods common to the lithographic trade may be used for coating and developing the metal base plate prior to application of the copper coating composition of this invention. For example, any of the water soluble resins and plastics may be employed for the initial coating. The most soluble form of polyvinyl alcohol is preferred for this purpose.

The invention will be further illustrated but is not intended to be limited by the following example of practice:

*Example*

A 10 per cent solution of polyvinyl alcohol, sensitized with 20 per cent ammonium dichromate in the ratio of 4 to 1, is a whirled dry on a clean zinc plate. The plate is exposed under a positive for 3 to 5 minutes by a 20,000 ampere carbon arc lamp at a distance of 6 feet. The plate is developed with a deep-etch developing solution, water, or a 50–50 water-alcohol solution. If additional hardening is desired, after developing, the plate may be dried with alcohol or acetone and exposed under the arc for several minutes. However, this is usually not necessary.

A solution is made up by mixing the following components: 5 parts of a 20% solution of neutralized copper sulfate, 7 parts of a 10% solution of pyrogallic acid, and 1 part of a 28% solution of ammonium hydroxide. These materials are mixed immediately before flowing over the developed image. The solution may be applied by spraying, or brushing, or other convenient manner. It is moved back and forth across the plate until the image is copper plated. This requires about one minute. After the coppering is finished, the depositing solution is flushed with water and the plate is dried by the use of acetone.

In order to remove the coating stencil without effecting the coppered image, the image is rubbed down with a suitable lacquer, dried, and then a light developing ink applied. When the latter has dried, the plate is covered with a 10% solution of citric acid for about three minutes. The stencil may now be removed by swabbing with cotton. The plate is then given a final cleaning and may be made more water receptive by the application of a 1 per cent solution of phosphoric acid. The finished plate may be used immediately or it may be gummed for future use.

If, after the plate is placed on the press, there are indications that it is not giving clean copy or that it is not inking readily, application of a suitable fountain etch, such as Colitho, will remedy these conditions.

Plates made by the process of this invention, because they are produced without the use of strong corrosive acids or abrasives, and do not require scrubbing with stiff brushes, have excellent line and dot formation. The cost of materials is low, and the materials are readily available at any chemical house. The process is one that requires no special equipment and is simple to operate. Thus, the invention may be practiced by any printing house, thereby effecting a considerable saving in the procurement of printing plates.

It will be appreciated from a reading of the foregoing specification that the invention herein described is susceptible of various changes and modifications without departing from the spirit and scope thereof.

What is claimed is:

1. A copper plating composition comprising an aqueous solution containing about 2 to 5 per cent of ammonium hydroxide, about 5 to 10 per cent of neutralized copper sulfate, and about 4 to 6 per cent of pyrogallol.

2. A copper plating composition consisting of a mixture of 5 parts of a 20 per cent solution of neutralized copper sulfate, 7 parts of a 10 per cent solution of pyrogallic acid, and 1 part of a 28 per cent solution of ammonium hydroxide.

3. A method of plating comprising treating a base metal more electropositive than copper with a solution containing about 2 to 5 per cent of ammonium hydroxide, about 5 to 10 per cent of a copper salt, and about 4 to 6 per cent of pyrogallol.

References Cited in the file of this patent

UNITED STATES PATENTS

| | | |
|---|---|---|
| 992,898 | Payne | May 23, 1911 |
| 2,429,107 | Petren | Oct. 14, 1947 |
| 2,437,005 | Schwarz | Mar. 2, 1948 |

OTHER REFERENCES

Wall, "Intensification and Reduction," American Photographic Publ. Co., Boston, Mass., 1927, page 11.